US012701654B2

(12) United States Patent
Lee

(10) Patent No.: US 12,701,654 B2
(45) Date of Patent: Aug. 4, 2026

(54) CIRCUIT BOARD AND MANUFACTURING METHOD THEREOF

(71) Applicant: SAMSUNG ELECTRO-MECHANICS CO., LTD., Suwon-si (KR)

(72) Inventor: Kyehwan Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 104 days.

(21) Appl. No.: 18/388,302

(22) Filed: Nov. 9, 2023

(65) Prior Publication Data

US 2024/0306292 A1     Sep. 12, 2024

(30) Foreign Application Priority Data

Mar. 8, 2023     (KR) ........................ 10-2023-0030514

(51) Int. Cl.
H05K 1/03     (2006.01)
H05K 1/05     (2006.01)
H05K 1/11     (2006.01)
H05K 3/24     (2006.01)
H05K 3/28     (2006.01)

(52) U.S. Cl.
CPC ........... H05K 1/0306 (2013.01); H05K 1/056 (2013.01); H05K 1/111 (2013.01); H05K 3/244 (2013.01); H05K 3/287 (2013.01)

(58) Field of Classification Search
CPC ...... H05K 1/0306; H05K 1/056; H05K 1/111; H05K 3/244; H05K 3/287

USPC ......................................................... 174/250
See application file for complete search history.

(56) References Cited

U.S. PATENT DOCUMENTS 8,193,555 B2     6/2012  Lin et al.
2007/0161223 A1  7/2007  Hu et al.
2007/0205520 A1  9/2007  Chou et al.
2010/0132998 A1  6/2010  Lee et al.
(Continued)

FOREIGN PATENT DOCUMENTS

JP         2020-141064 A     9/2020
KR    10-2010-0060968 A     6/2010
(Continued)

OTHER PUBLICATIONS

Office Action issued on Jun. 5, 2026 in Korean Patent Application No. 10-2023-0030514 with English translation.

*Primary Examiner* — Andargie M Aychillhum
(74) *Attorney, Agent, or Firm* — Morgan, Lewis & Bockius LLP

(57)     ABSTRACT

A circuit board includes: an insulating layer, a solder resist layer disposed on the insulating layer and having first and second openings; first and second connection pads respectively disposed within the first and second openings on the insulating layer; and first and second conductive layers respectively disposed on the first and second connection pads, and configured to protrude more than an upper surface of the solder resist layer and to have different thicknesses. Each of the first and second conductive layers includes a lower conductive layer disposed on a corresponding one of the first and second connection pads and an upper conductive layer disposed on an upper surface of the lower conductive layer.

20 Claims, 8 Drawing Sheets

(56)     References Cited

U.S. PATENT DOCUMENTS

| 2011/0284269 A1* | 11/2011 | Maeda | ................... | H05K 1/113 |
| | | | | 174/251 |
| 2016/0165723 A1* | 6/2016 | Romero | ............ | H01L 23/49827 |
| | | | | 174/251 |
| 2019/0103288 A1* | 4/2019 | Cho | ................... | H01L 23/49866 |
| 2020/0006244 A1* | 1/2020 | Sciriha | .................... | H01L 24/05 |
| 2022/0189865 A1* | 6/2022 | Ko | .................... | H01L 23/49838 |
| 2022/0261049 A1* | 8/2022 | Yun | ........................ | H05K 1/117 |

FOREIGN PATENT DOCUMENTS

| KR | 10-2013-0057803 A | 6/2013 |
| KR | 10-2022-0086321 A | 6/2022 |

* cited by examiner

CIRCUIT BOARD AND MANUFACTURING METHOD THEREOF

CROSS-REFERENCE TO RELATED APPLICATION

This application claims priority to and the benefit of Korean Patent Application No. 10-2023-0030514, filed in the Korean Intellectual Property Office on Mar. 8, 2023, the entire contents of which are incorporated herein by reference.

TECHNICAL FIELD

The present disclosure relates to a circuit board and a manufacturing method thereof.

BACKGROUND

With recent development of the electronics industry, as electronic devices are becoming more and more high-performance, semiconductor packages are being miniaturized and thinned, and at the same time, to have high density. In order to increase the density of semiconductor packages, a number of integrated circuits to be mounted increases, and a number of input or output connection terminals has also to be increased. Accordingly, it is necessary to implement a microcircuit having a reduced pitch of a bonding pad, and a method of manufacturing a high-density semiconductor package for this purpose is required.

In the method of manufacturing the high-density semiconductor package, a wire bonding method and a flip bonding method are used by using a mounting method of an integrated circuit. As the number of input or output connection terminals increases, the flip bonding method is preferred in consideration of a manufacturing cost when mounting an integrated circuit. However, even in the case of mounting the wire bonding chip, a bond finger implemented as a fine circuit pattern on a circuit board is required.

In order to have a wire bonding environment, it is necessary to secure a thickness of a nickel plating layer of the bond finger formed by an embedded trace substrate (ETS) method, but in this case, it is difficult to maintain a gap between bond fingers due to the increased thickness of the nickel plating layer. In addition, since an edge of the bond finger is rounded by a thicker nickel plating layer, a bonded area may be reduced during wire bonding, thereby deteriorating bonding reliability.

The above information disclosed in this Background section is only for enhancement of understanding of the background of the disclosure, and therefore, it may contain information that does not form the prior art that is already known in this country to a person of ordinary skill in the art.

SUMMARY

Embodiments have been made in an effort to provide a circuit board and a manufacturing method thereof capable of preventing a short circuit between wires during wire bonding, reducing a manufacturing cost, and improving bonding reliability.

However, the problem to be solved by the embodiments is not limited to the above-described problem, and can be variously extended within the scope of the technical spirit included in the embodiments.

An embodiment provides a circuit board including: an insulating layer; a solder resist layer disposed on the insulating layer and having first and second openings; first and second connection pads respectively disposed within the first and second openings on the insulating layer; and first and second conductive layers respectively disposed on the first and second connection pads, and configured to protrude more than an upper surface of the solder resist layer and to have different thicknesses. Each of the first and second conductive layers includes a lower conductive layer disposed on a corresponding one of the first and second connection pads and an upper conductive layer disposed on an upper surface of the lower conductive layer.

The first and second conductive layers may be respectively disposed in the first and second openings.

A portion of a side surface of the lower conductive layer may be in contact with the solder resist layer, and a side surface of the upper conductive layer may be spaced apart from the solder resist layer.

The upper conductive layer may cover only the upper surface of the lower conductive layer among a side surface and the upper surface of the lower conductive layer.

Thicknesses of the lower conductive layers of the first and second conductive layers with respect to upper surfaces of the first and second connection pads may be different from each other.

An upper surface of the upper conductive layer may be flat and parallel to a first surface of the insulating layer on which the first and second connection pads are disposed.

The upper conductive layer may be disposed at a higher position than the upper surface of the solder resist layer along a direction perpendicular to the first surface of the insulating layer.

A width of the upper conductive layer of the first conductive layer may be wider than a maximum width of the first connection pad.

A width of the lower conductive layer of the first conductive layer at an interface between the lower conductive layer and the upper conductive layer of the first conductive layer may be wider than the maximum width of the first connection pad.

The first connection pad, the lower conductive layer of the first conductive layer, and the upper conductive layer of the first conductive layer may include different materials.

The first connection pad may include copper, the lower conductive layer of the first conductive layer may include nickel, and the upper conductive layer of the first conductive layer may include gold.

The first connection pad and the second connection pad may have substantially the same thickness.

In addition, an embodiment provides a manufacturing method of a circuit board, including: forming first and second connection pads on an insulating layer; forming a solder resist layer having first and second openings respectively overlapping the first and second connection pads on the insulating layer; and forming first and second conductive layers on the first and second connection pads, respectively, protruding more than an upper surface of the solder resist layer and having different thicknesses.

The forming of the first and second conductive layers may include: forming a first photosensitive film blocking the second opening; forming the first conductive layer on the first opening not blocked by the first photosensitive film by using a first plating process; removing the first photosensitive film; forming a second photosensitive film blocking the first opening; forming the second conductive layer on the second opening not blocked by the second photosensitive film by using a second plating process; removing the second photosensitive film; and thinning a thickness of the solder resist layer.

The thinning of the thickness of the solder resist layer may include allowing the first and second conductive layers to protrude more than the upper surface of the solder resist layer.

Each of the first and second conductive layer may include a lower conductive layer disposed on a corresponding one of the first and second connection pads and an upper conductive layer disposed on an upper surface of the lower conductive layer, and the allowing of the first and second conductive layers to protrude more than the upper surface of the solder resist layer may include allowing a portion of a side surface of the lower conductive layer to be in contact with the solder resist layer, and allowing a side surface of the upper conductive layer to be separated from the solder resist layer.

The first and second conductive layers respectively formed by the first and second plating process, may respectively fill the first and second openings i. A width of the conductive layer may be equal to a width of the opening and a width of the second conductive layer may be equal to a width of the second opening.

The first and second connection pads may be formed by a same process, and the first and second conductive layers may be formed by different processes.

According to the embodiments, wire bonding is possible without using a wire bonding auxiliary tool such as a capillary tool by forming the conductive layers electrically connected to the connection pads constituting bond fingers so as to protrude more than the upper surface of the solder resist layer.

In addition, it is possible to prevent a short between adjacent wires during wire bonding by making the thicknesses of the conductive layers electrically connected to the connection pads different from each other, and thus bond fingers of microcircuits may be formed, and an assembly margin may be secured.

In addition, the upper conductive layer of the conductive layer may be disposed only on the upper surface of the lower conductive layer and may not cover the side surface of the lower conductive layer, and thus an amount of the upper conductive layer containing expensive gold (Au) may be minimized, thereby reducing a manufacturing cost.

In addition, although the side surface of the connection pad is formed to be inclined, the upper surface of the upper conductive layer disposed on the connection pad is flat, and thus when the wire is bonded to the upper surface of the upper conductive layer, a bonding area between the wire and the upper surface of the upper conductive layer may be increased. Accordingly, adhesion failure between the wire and the conductive layer may be minimized, thereby improving bonding reliability.

However, it is obvious that the effect of the embodiments is not limited to the above-described effect, and may be variously extended without departing from the spirit and scope of the embodiments.

BRIEF DESCRIPTION OF THE DRAWINGS

FIG. 1 illustrates a cross-sectional view of a circuit board according to an embodiment.

4

Figure 2:
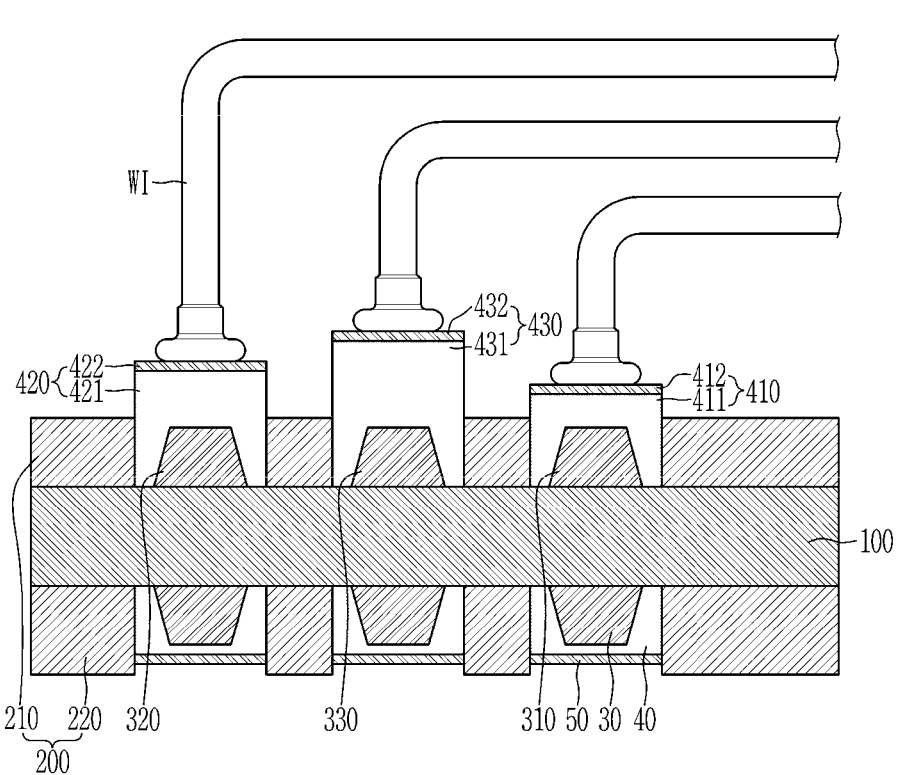
FIG. 2 illustrates a cross-sectional view of a state in which wires are bonded to the circuit board of FIG. 1.

FIG. 3 to FIG. 8 sequentially illustrate cross-sectional views showing a manufacturing method of a circuit board according to an embodiment.

DETAILED DESCRIPTION OF THE EMBODIMENTS

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

To clearly describe the present disclosure, parts that are irrelevant to the description are omitted, and like numerals refer to like or similar constituent elements throughout the specification.

The accompanying drawings are provided only in order to allow embodiments disclosed in the present specification to be easily understood and are not to be interpreted as limiting the spirit disclosed in the present specification, and it is to be understood that the present disclosure includes all modifications, equivalents, and substitutions without departing from the scope and spirit of the present disclosure.

Further, since sizes and thicknesses of constituent members shown in the accompanying drawings are arbitrarily given for better understanding and ease of description, the present disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means when an object portion is viewed from above, and the phrase "in a cross-sectional view" means when a cross-section taken by vertically cutting an object portion is viewed from the side.

In addition, throughout the specification, "connected" means that two or more components are not only directly connected, but two or more components may be connected indirectly through other components, physically connected as well as being electrically connected, or it may be referred to by different names depending on the location or function, but may mean integral.

Hereinafter, various embodiments and modifications will be described in detail with reference to drawings.

Figure 1:
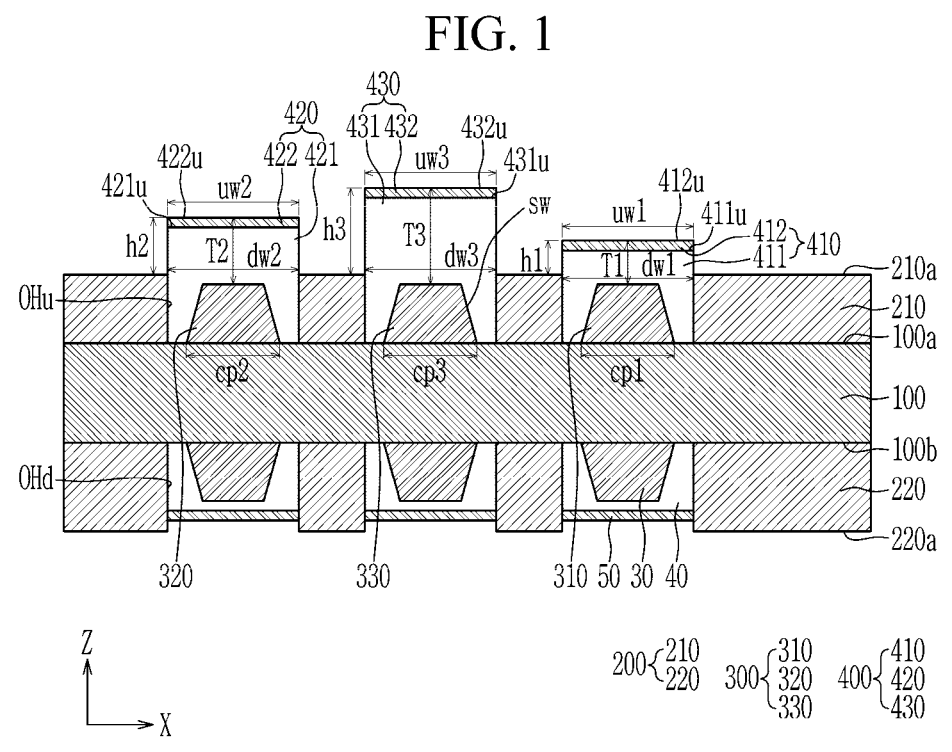

FIG. 1 illustrates a cross-sectional view of a circuit board according to an embodiment.

As illustrated in FIG. 1, a circuit board according to an embodiment includes an insulating layer 100, a solder resist layer 200, a plurality of connection pads 300, and a plurality of conductive layers 400. Herein, the connection pad 300 and the conductive layer 400 may form a bond finger together.

The insulating layer 100 has a predetermined thickness, and thus it may have a first surface 100a and a second surface 100b that are spaced apart from each other and oppose each other. The insulating layer 100 may include a thermosetting resin such as an epoxy resin or polyimide, a thermoplastic resin such as polyethylene (PE), polycarbonate (PC), or polyvinyl chloride (PVC), or a resin including a reinforcing material such as a glass fiber or an inorganic filler together with these. For example, the insulating layer 100 may include prepreg, an ajinomoto buildup film (ABF), a photo image-able dielectric (PID), and the like.

The solder resist layer 200 may include a first solder resist layer 210 and a second solder resist layer 220.

The first solder resist layer 210 may cover the first surface 100a of the insulating layer 100. The first solder resist layer 210 may have a plurality of openings OHu overlapping the connection pads 300. The openings OHu may be spaced apart from each other.

The second solder resist layer 220 may cover the second surface 100b of the insulating layer 100. The second solder resist layer 220 may have a plurality of openings OHd overlapping a plurality of subconnection pads 30 disposed on the second surface 100b of the insulating layer 100. The openings OHd may be spaced apart from each other.

The second solder resist layer 220 may include an insulating material such as solder resist.

The connection pads 300 may be disposed on the first surface 100a of the insulating layer 100, and may be respectively disposed in the openings OHu. The connection pads 300 may include a first connection pad 310, a second connection pad 320, and a third connection pad 330. In the present embodiment, three connection pads are described as an example for better understanding and ease of description, but the present disclosure is not necessarily limited thereto.

The first connection pad 310, the second connection pad 320, and the third connection pad 330 may have a same height. In this case, a side surface sw of each of the connection pads 310, 320, and 330 may be inclined.

The connection pads 300 may be disposed in various patterns on the first surface 100a of the insulating layer 100. The connection pads 300 may include a conductive material such as copper (Cu), aluminum (Al), silver (Ag), tin (Sn), gold (Au), nickel (Ni), lead (Pb), titanium (Ti), or an alloy thereof.

The conductive layers 400 may be disposed on the connection pads 300 while filling the openings OHu of the first solder resist layer 210. At least two of the conductive layers 400 may have different thicknesses.

For example, a first thickness T1, which is a thickness of a first conductive layer 410 disposed on the first connection pad 310, may be thinner than a second thickness T2, which is a thickness of a second conductive layer 420 disposed on the second connection pad 320, may be thinner than a third thickness T3, which is a thickness of a third conductive layer 430 disposed on the third connection pad 330. In addition, the second thickness T2 may be thinner than the third thickness T3. Herein, the first thickness T1, the second thickness T2, and the third thickness T3 respectively have thicknesses based on upper surfaces of the first connection pad 310, the second connection pad 320, and the third connection pad 330.

In this way, by making thicknesses of the conductive layers 400 different from each other, it is possible to prevent a short circuit between adjacent wires during wire bonding, and thus an assembly margin may be secured.

In the present embodiment, the thicknesses of the first conductive layer 410, second conductive layer 420, and third conductive layer 430 constituting the conductive layers 400 are all different, but the present disclosure is not limited thereto, and an embodiment in which only the thicknesses of some of the conductive layers are different from each other is also possible.

The conductive layers 410, 420, and 430 may respectively include lower conductive layers 411, 421, and 431 disposed on the connection pads 310, 320, and 330 and the upper conductive layers 412, 422, and 432 disposed on upper surfaces 411u, 421u, and 431u of the lower conductive layers 411, 421, and 431. In the present embodiment, the lower conductive layers 411, 421, and 431 may include nickel (Ni), and the upper conductive layers 412, 422, and 432 may include gold (Au), but the present disclosure is not necessarily limited thereto, and they may be made of various conductive materials.

In this case, the upper conductive layers 412, 422, and 432 may be respectively disposed only on the upper surfaces 411u, 421u, and 431u of the lower conductive layers 411, 421, and 431, and may not cover side surfaces of the lower conductive layers 411, 421, and 431.

For example, the first upper conductive layer 412 of the first conductive layer 410 may be disposed only on the upper surface 411u of the first lower conductive layer 411 of the first conductive layer 410, and may not cover the side surfaces of the first lower conductive layer 411. The second upper conductive layer 422 of the second conductive layer 420 may be disposed only on the upper surface 421u of the second lower conductive layer 421 of the second conductive layer 420, and may not cover the side surfaces of the second lower conductive layer 421. The third upper conductive layer 432 of the third conductive layer 430 may be disposed only on the upper surface 431u of the third lower conductive layer 431 of the third conductive layer 430, and may not cover the side surfaces of the third lower conductive layer 431.

Accordingly, an amount of the upper conductive layers 412, 422, and 432 containing expensive gold (Au) may be minimized, and a manufacturing cost may be reduced.

The conductive layers 400 may protrude more than an upper surface 210a of the first solder resist layer 210. That is, portions of side surfaces of the lower conductive layers 411, 421, and 431 may contact the first solder resist layer 210. The side surfaces of the upper conductive layers 412, 422, and 432 may be separated without contacting the first solder resist layer 210. In addition, the upper surfaces 412u, 422u, and 432u of the upper conductive layers 412, 422, and 432 may be disposed higher than the upper surface 210a of the first solder resist layer 210 along a direction Z perpendicular to the first surface 100a of the insulating layer 100.

As such, wire bonding may be easily performed without using a wire bonding auxiliary tool such as a capillary tool by forming the conductive layers 400 electrically connected to the connection pads 300 forming bond fingers so as to protrude more than the upper surface 210a of the first solder resist layer 210.

In this case, a height h1 of the upper surface 412u of the first upper conductive layer 412 based on the first surface 100a of the insulating layer 100 may be lower than a height h2 of the upper surface 422u of the second upper conductive layer 422, and the height h2 of the top surface 422u of the second upper conductive layer 422 may be lower than a height h3 of the upper surface 423u of the third upper conductive layer 423.

In addition, the upper surfaces 412u, 422u, and 432u of the upper conductive layers 412, 422, and 432 may be flat and parallel to the first surface 100a of the insulating layer 100.

FIG. 2 illustrates a cross-sectional view of a state in which wires are bonded to the circuit board of FIG. 1.

As illustrated in FIG. 2, side surfaces sw of the connection pads 310, 320, and 330 are inclined, but the upper surfaces 412u, 422u, and 432u of the upper conductive layers 412, 422, and 432 disposed on the connection pads 310, 320, and 330 are flat, and thus when a wire WI is bonded to the upper surfaces 412u, 422u, and 432u of the upper conductive layers 412, 422, and 432, an adhesion area between the wire WI and the upper surfaces 412u, 422u, and 432u of the upper conductive layers 412, 422, and 432 may be increased. Accordingly, adhesion failure between the wire WI and the conductive layer 400 may be minimized, thereby improving bonding reliability.

In the present embodiment, the conductive layer 400 may be formed by an electroless plating process such as electroless nickel immersion gold (ENIG). That is, as a method of reducing metal ions from a metal salt solution to a surface of an object to be plated to form a metal film, lower conductive layers 411, 421, and 431 containing nickel and upper conductive layers 412, 422, and 432 containing gold may be formed.

Widths uw1, uw2, and uw3 of the upper conductive layers 412, 422, and 432 may be wider than maximum widths cp1, cp2, and cp3 of the connection pads 310, 320, and 330. In addition, at interface between the lower conductive layers 411, 421, and 431 and the upper conductive layers 412, 422, and 432, and the widths dw1, dw2, and dw3 of the lower conductive layers 411, 421, and 431 may be wider than the maximum widths cp1, cp2, and cp3 of the connection pads 310, 320, and 330. At the interface between the lower conductive layers 411, 421, and 431 and the upper conductive layers 412, 422, and 432, the widths dw1, dw2, and dw3 of the lower conductive layers 411, 421, and 431 may be the same as the widths uw1, uw2, and uw3 of the upper conductive layers 412, 422, and 432.

Meanwhile, subconductive layers 40 and 50 electrically connected to subconnection pads may be disposed in the openings OHd of the second solder resist layer 220. The subconductive layers 40 and 50 may include a sublower conductive layer 40 made of a same material as that of the lower conductive layers 411, 421, and 431 and a subupper conductive layer 50 made of a same material as that of the upper conductive layers 412, 422, and 432. These subconductive layers 40 and 50 may be electrically connected to other circuit boards and electronic components by using separate solder balls (not illustrated). In one example, the subupper conductive layer 50 may be disposed closer to the second surface 100b of the insulating layer 100 than a lower surface 220a of the second solder resist layer 220.

Hereinafter, a manufacturing method of a circuit board according to an embodiment will be described in detail with reference to FIG. 3 to FIG. 8 together with FIG. 1.

FIG. 3 to FIG. 8 sequentially illustrate cross-sectional views showing a manufacturing method of a circuit board according to an embodiment.

Figure 3:
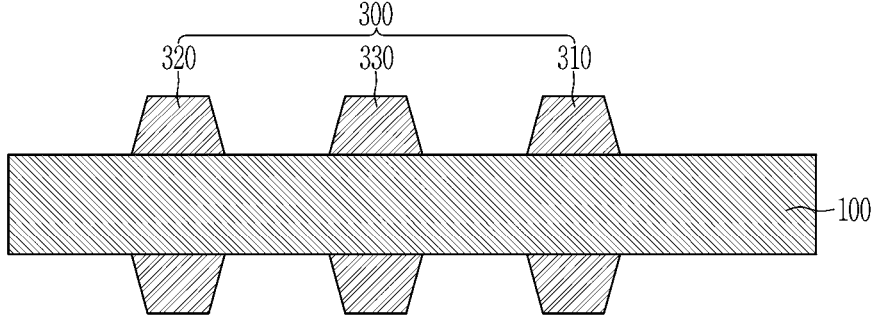

As illustrated in FIG. 3, the connection pads 300 spaced apart from each other are disposed on the insulating layer 100. The connection pads 300 may include a first connection pad 310, a second connection pad 320, and a third connection pad 330. In the present embodiment, three connection pads are described as an example for better understanding and ease of description, but the present disclosure is not necessarily limited thereto.

Figure 4:
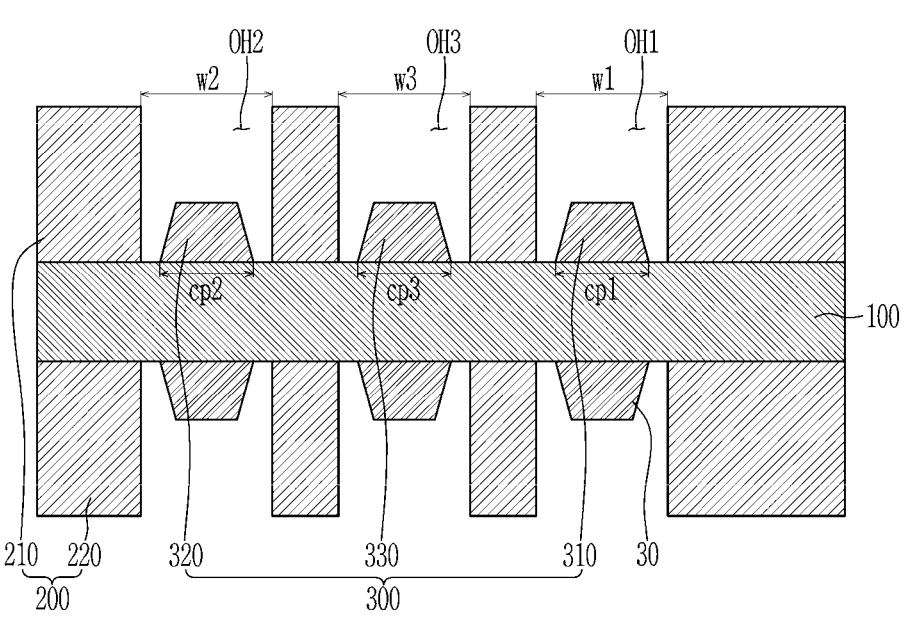

As illustrated in FIG. 4, the solder resist layer 200 is disposed on the insulating layer 100. Then, the solder resist layer 200 is patterned to form a plurality of openings OH1, OH2, and OH3 overlapping the connection pads 310, 320, and 330 in the solder resist layer 200. In this case, the widths w1, w2, and w3 of the plurality of openings OH1, OH2, and OH3 may be greater than the maximum widths cp1, cp2, and cp3 of the connection pads 310, 320, and 330.

As illustrated in FIG. 5 to FIG. 8, a plurality of conductive layers 410, 420, and 430 protruding more than the upper surface 210a of the first solder resist layer 210 and having at least two different thicknesses are formed on the connection pads 310, 320, and 330.

This will be described in more detail below using an embodiment in which three conductive layers are formed.

Figure 5:
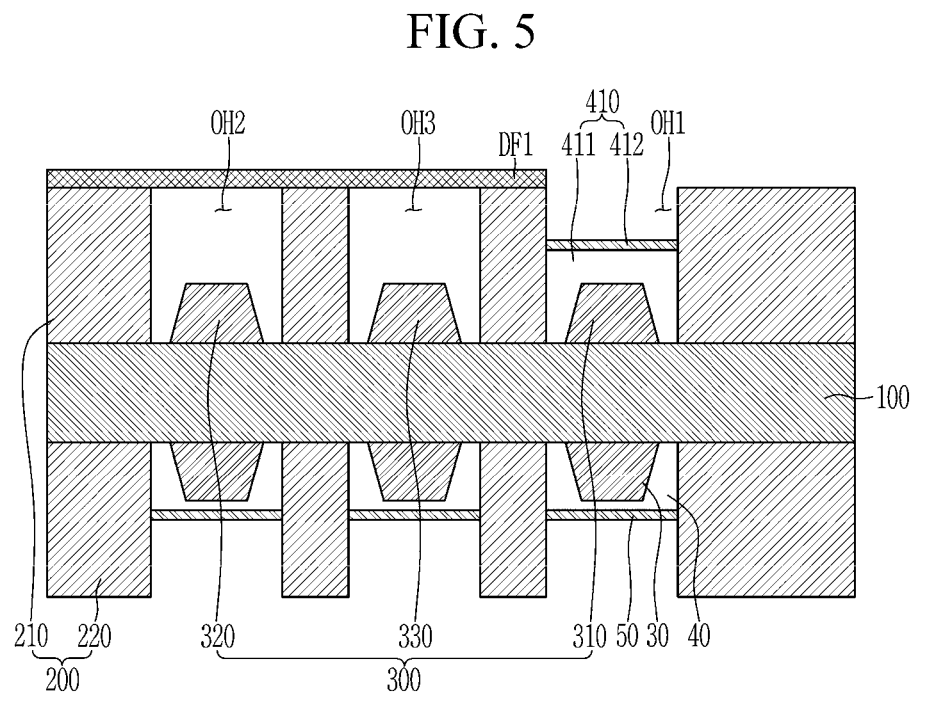

As illustrated in FIG. 5, a first process of forming a first photosensitive film DF1 blocking the second opening OH2 and the third opening OH3 among the plurality of openings OH1, OH2, and OH3 is performed. The first photosensitive film DF1 is disposed on the first solder resist layer 210. Then, a second process of forming the first conductive layer 410 is performed only in the openings in the second solder resist layer 220 and the first opening OH1 not blocked by the first photosensitive film DF1 among the openings OH1, OH2, and OH3 by using a plating process.

Figure 6:
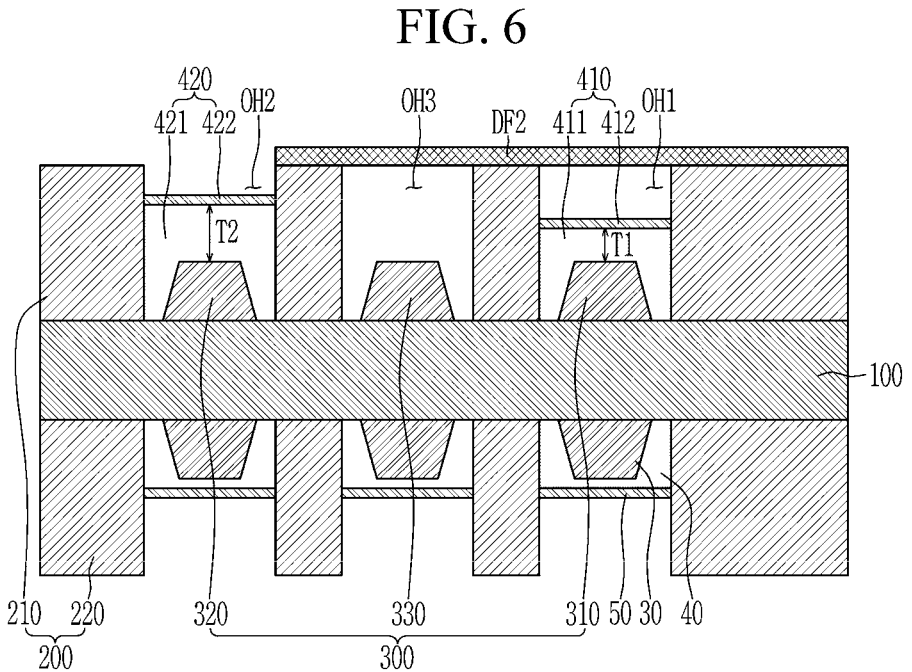

As illustrated in FIG. 6, a third process of removing the first photosensitive film DF1 is performed. Then, the first process of forming the second photosensitive film DF2 blocking the first opening OH1 and the third opening OH3 among the openings OH1, OH2, and OH3 is performed. The second photosensitive film DF2 is disposed on the first solder resist layer 210. Then, the second process of forming the second conductive layer 420 is performed again in only the second opening OH2 not blocked by the second photosensitive film DF2 among the openings OH1, OH2, and OH3 by using the plating process. In this case, the second thickness T2, which is a thickness of the second conductive layer 420, may be thicker than the first thickness T1, which is a thickness of the first conductive layer 410.

Figure 7:
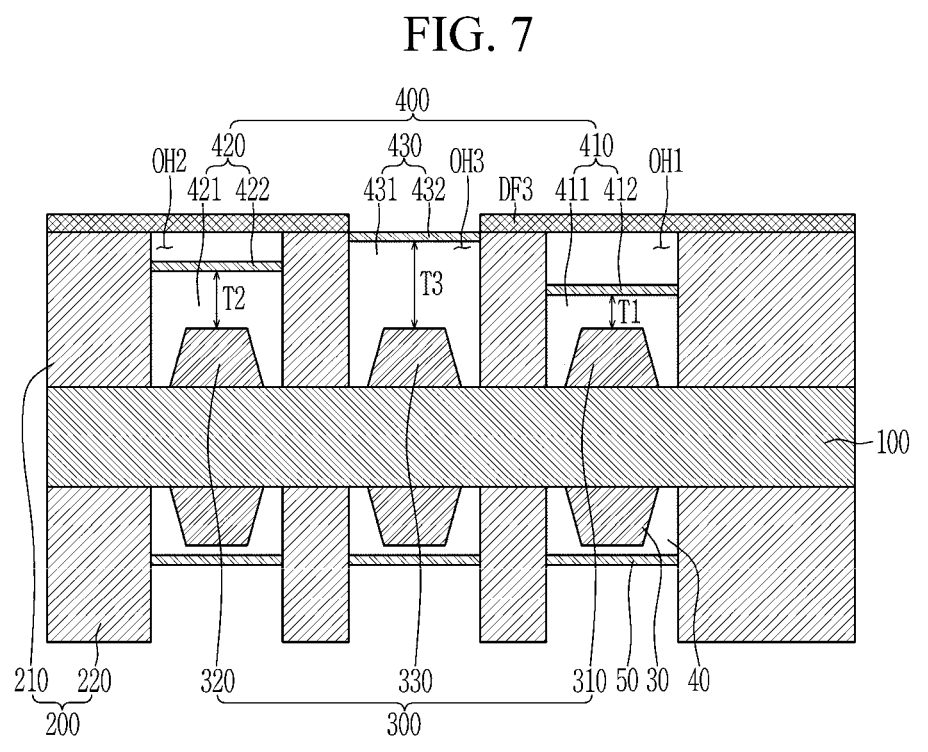

As illustrated in FIG. 7, The third process of removing the second photosensitive film DF2 is performed again. Then, the first process of forming the third photosensitive film DF3 blocking the first opening OH1 and the second opening OH2 among the openings OH1, OH2, and OH3 is performed. The third photosensitive film DF3 is disposed on the first solder resist layer 210. Then, the second process of forming the third conductive layer 430 is performed again in only the third opening OH3 not blocked by the third photosensitive film DF3 among the openings OH1, OH2, and OH3 by using the plating process. In this case, the third thickness T3, which is a thickness of the third conductive layer 430, may be thicker than the second thickness T2, which is a thickness of the second conductive layer 420.

As such, the opening OH1, OH2, and OH3 may be filled with the conductive layers 410, 420, and 430 having different thicknesses by repeating the first process, the second process, and the third process.

In this case, the conductive layers 410, 420, and 430 including the lower conductive layers 411, 421, and 431 and the upper conductive layers 412, 422, and 432 fill the openings OH1, OH2, and OH3, and thus the widths dw1, dw2, and dw3 (see FIG. 1) of the lower conductive layers 411, 421, and 431 or the widths uw1, uw2, and uw3 (see FIG. 1) of the upper conductive layers 412, 422, and 432 may be equal to the widths w1, w2, and w3 of the openings OH1, OH2, and OH3.

Figure 8:
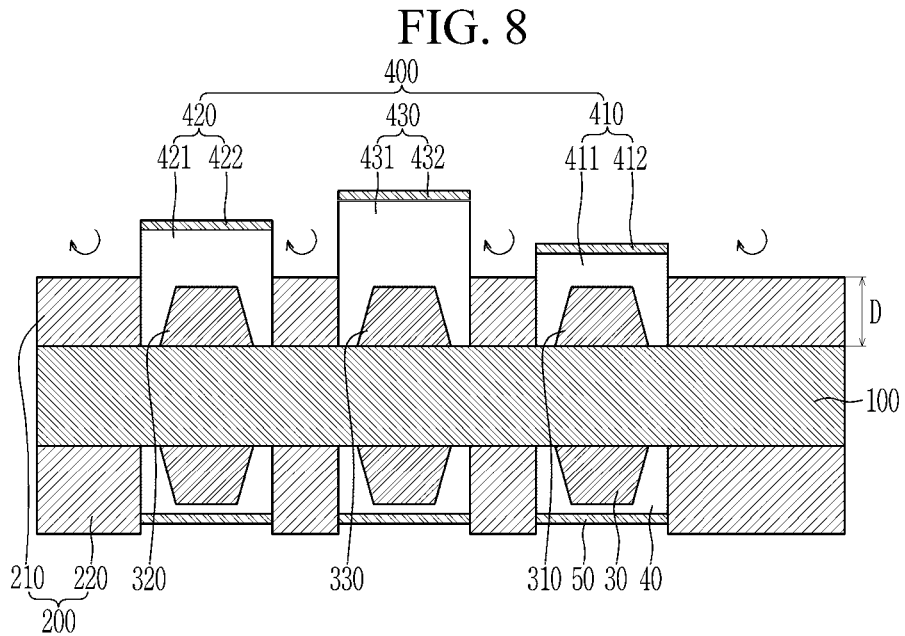

As illustrated in FIG. 8, a thickness D of the first solder resist layer 210 may be reduced.

Thinning of the solder resist layer may be performed by a chemical process. With the chemical process, the solder resist layer may be thinned in the following order.

First, solder resist is immersed in a chemical etching solution (e.g., RT-300 (chemical)), and a part of the solder resist is chemically treated and dissociated. The chemical etching solution induces bonding between binder polymers of the solder resist to replace the carboxy group, thereby removing reactivity. Accordingly, it is possible to prevent a photo-crosslinking monomer and a photopolymerization initiator from binding to the carboxy group of the binder polymer.

Next, the chemically treated and dissociated solder resist may be removed by dissolving it with an etching spray (e.g., an R solution (spray)). When the photocurable monomer and the photopolymerization initiator do not work, photocuring becomes impossible, and the binder polymer in a micelle state may be dissolved by the etching spray. Finally, after final water rinse, only a portion of the solder resist layer remains.

On the other hand, as another example, the thinning of the solder resist layer is also possible by a physical process using a laser.

As such, the conductive layers 410, 420, and 430 having different thicknesses may protrude more than the upper surface 210a of the first solder resist layer 210 by reducing the thickness of the first solder resist layer 210. That is, portions of the side surfaces of the lower conductive layers 411, 421, and 431 contact the first solder resist layer 210, and side surfaces of the upper conductive layers 412, 422, and 432 do not contact the first solder resist layer 210 and may be separated.

As such, the first solder resist layer 210 having an opening overlapping the connection pads 300 serves as a dam supporting the conductive layer 400 disposed on the connection pads 300, and thus overhang of the conductive layer 400 formed through the plating process may be prevented. Accordingly, even when a distance between the connection pads 300 used as bond fingers is close, a short circuit between the conductive layers 400 due to the overhang of the conductive layers 400 may be minimized.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A circuit board comprising:
an insulating layer;
a solder resist layer disposed on the insulating layer and having first and second openings;
first and second connection pads respectively disposed within the first and second openings on the insulating layer;
a first conductive layer disposed on the first connection pad and protruding more than an upper surface of the solder resist layer; and
a second conductive layer disposed on the second connection pad and protruding more than the upper surface of the solder resist layer, wherein the first conductive layer and the second conductive layer have different thicknesses, and
each of the first and second conductive layers includes a lower conductive layer disposed on a corresponding one of the first and second connection pads and an upper conductive layer disposed on an upper surface of the lower conductive layer.

2. The circuit board of claim 1, wherein the first and second conductive layers are respectively disposed in the first and second openings.

3. The circuit board of claim 1, wherein a portion of a side surface of the lower conductive layer is in contact with the solder resist layer, and a side surface of the upper conductive layer is spaced apart from the solder resist layer.

4. The circuit board of claim 1, wherein the upper conductive layer covers only the upper surface of the lower conductive layer among a side surface and the upper surface of the lower conductive layer.

5. The circuit board of claim 1, wherein thicknesses of the lower conductive layers of the first and second conductive layers with respect to upper surfaces of the first and second connection pads are different from each other.

6. The circuit board of claim 1, wherein an upper surface of the upper conductive layer is flat and parallel to a first surface of the insulating layer on which the first and second connection pads are disposed.

7. The circuit board of claim 6, wherein the upper conductive layer is disposed at a higher position than the upper surface of the solder resist layer along a direction perpendicular to the first surface of the insulating layer.

8. The circuit board of claim 1, wherein a width of the upper conductive layer of the first conductive layer is wider than a maximum width of the first connection pad.

9. The circuit board of claim 8, wherein a width of the lower conductive layer of the first conductive layer at an interface between the lower conductive layer and the upper conductive layer of the first conductive layer is wider than the maximum width of the first connection pad.

10. The circuit board of claim 1, wherein the first connection pad, the lower conductive layer of the first conductive layer, and the upper conductive layer of the first conductive layer include different materials.

11. The circuit board of claim 10, wherein the first connection pad includes copper, the lower conductive layer of the first conductive layer includes nickel, and the upper conductive layer of the first conductive layer includes gold.

12. The circuit board of claim 1, wherein the first connection pad and the second connection pad have substantially the same thickness.

13. A circuit board comprising:
an insulating layer;
a solder resist layer disposed on the insulating layer and having first and second openings;
first and second connection pads respectively disposed within the first and second openings on the insulating layer;
a first conductive layer disposed on the first connection pad and protruding more than an upper surface of the solder resist layer; and

a second conductive layer disposed on the second con-
nection pad and protruding more than the upper surface
of the solder resist layer, wherein the first conductive layer and the second conduc-
tive layer have different thicknesses, each of the first and second conductive layers includes a
lower conductive layer disposed on a corresponding
one of the first and second connection pads and an
upper conductive layer disposed on an upper surface of
the lower conductive layer, and the lower conductive layer is in physical contact with the
solder resist layer.

14. The circuit board of claim 13, wherein the first and second conductive layers are respectively
disposed in the first and second openings.

15. The circuit board of claim 13, wherein a portion of a side surface of the lower conductive layer
is in physical contact with the solder resist layer, and a side surface of the upper conductive layer is spaced
apart from the solder resist layer.

16. The circuit board of claim 13, wherein
the upper conductive layer covers only the upper surface
of the lower conductive layer among a side surface and
the upper surface of the lower conductive layer.

17. The circuit board of claim 13, wherein
thicknesses of the lower conductive layers of the first and
second conductive layers with respect to upper surfaces
of the first and second connection pads are different
from each other.

18. The circuit board of claim 13, wherein
an upper surface of the upper conductive layer is flat and
parallel to a first surface of the insulating layer on
which the first and second connection pads are dis-
posed.

19. The circuit board of claim 13, wherein
the first connection pad, the lower conductive layer of the
first conductive layer, and the upper conductive layer of
the first conductive layer include different materials.

20. The circuit board of claim 19, wherein
the first connection pad includes copper, the lower con-
ductive layer of the first conductive layer includes
nickel, and the upper conductive layer of the first
conductive layer includes gold.

* * * * *